US010147593B2

(12) United States Patent
Baba

(10) Patent No.: US 10,147,593 B2
(45) Date of Patent: Dec. 4, 2018

(54) ION SORTER

(71) Applicant: DH Technologies Development Pte. Ltd., Singapore (SG)

(72) Inventor: Takashi Baba, Richmond Hill (CA)

(73) Assignee: DH Technologies Development Pte. Ltd., Singapore (SG)

( * ) Notice: Subject to any disclaimer, the term of this patent is extended or adjusted under 35 U.S.C. 154(b) by 39 days.

(21) Appl. No.: 15/513,271

(22) PCT Filed: Oct. 14, 2015

(86) PCT No.: PCT/IB2015/057877
§ 371 (c)(1),
(2) Date: Mar. 22, 2017

(87) PCT Pub. No.: WO2016/079615
PCT Pub. Date: May 26, 2016

(65) Prior Publication Data
US 2017/0250064 A1     Aug. 31, 2017

Related U.S. Application Data

(60) Provisional application No. 62/082,046, filed on Nov. 19, 2014.

(51) Int. Cl.
*H01J 49/26*     (2006.01)
*B01D 59/48*     (2006.01)
(Continued)

(52) U.S. Cl.
CPC ............. *H01J 49/26* (2013.01); *B01D 59/48* (2013.01); *H01J 37/317* (2013.01); *H01J 49/02* (2013.01); *H01J 49/48* (2013.01)

(58) Field of Classification Search
CPC .......... H01J 49/26; H01J 37/317; H01J 49/02; H01J 49/48; B01D 59/48
(Continued)

(56) References Cited

U.S. PATENT DOCUMENTS 6,639,227 B1    10/2003   Glavish et al.
6,815,674 B1    11/2004   Voss
(Continued)

FOREIGN PATENT DOCUMENTS

JP    1997-213498 A    8/1997
JP    2001-023564 A    1/2001

OTHER PUBLICATIONS

International Search Report and Written Opinion for PCT/IB2015/057877, dated Mar. 25, 2016.

*Primary Examiner* — Nicole Ippolito
(74) *Attorney, Agent, or Firm* — John R. Kasha; Kelly L. Kasha; Kasha Law LLC

(57) ABSTRACT

A static magnetic field is applied in the same direction using a first magnet and a second magnet. The magnetic field is applied to a gap of uniform thickness between the first and second magnets. Voltages are applied to three or more electrodes located in the gap using a switchable voltage source. The voltages are applied to create a static electric field perpendicular to the static magnetic field in an input channel and at least one channel of two or more output channels. The channels are defined by gaps between the three or more electrodes. The simultaneous application of the static magnetic field and the static electric field causes ions from an ion beam of a mass spectrometer to move into and through the input channel and through at least one channel of the two or more output channels to another location in the mass spectrometer.

21 Claims, 10 Drawing Sheets

(51) Int. Cl.
*H01J 49/02* (2006.01)
*H01J 49/48* (2006.01)
*H01J 37/317* (2006.01)

(58) Field of Classification Search
USPC .......................................... 250/281, 282, 283
See application file for complete search history.

(56) References Cited

U.S. PATENT DOCUMENTS

| | | | |
|---|---|---|---|
| 9,299,461 B2* | 3/2016 | Burke | G21B 1/03 |
| 2003/0168588 A1* | 9/2003 | Brailove | H01J 49/284 |
| | | | 250/281 |
| 2005/0017166 A1* | 1/2005 | Scheidemann | H01J 49/0095 |
| | | | 250/288 |
| 2008/0185516 A1 | 8/2008 | Baba et al. | |
| 2017/0330739 A1* | 11/2017 | Hosaka | H01J 49/06 |

* cited by examiner

ION SORTER

CROSS REFERENCE TO RELATED APPLICATION

This application claims the benefit of U.S. Provisional Patent Application Ser. No. 62/082,046, filed Nov. 19, 2014, the content of which is incorporated by reference herein in its entirety.

INTRODUCTION

U.S. Provisional Application No. 61/920,333 (hereinafter the "'333 Application") proposes selective transmission of ions having selected mass ranges to a plurality of downstream ion traps (e.g., an ion trap array), and/or to differentially or simultaneously detect the ions confined in each of the plurality of ion traps. In other words, the '333 Application proposes transmitting ions from a single ion transmission source to two or more mass analyzers so that ions can be analyzed simultaneously. Such simultaneous analysis can improve the overall throughput of a mass spectrometer.

The '333 Application further suggests using an ion selector to transmit a portion of the plurality of ions being mass-dependently ejected into a corresponding one of the plurality of ion traps based on a mass range of the plurality of ions being mass-dependently ejected from an ion transmission source (a single multipole ion trap). The ion selector is described as being an ion deflector that deflects ions from the ion beam scanned out of a single multipole ion trap into one of a plurality of ion traps.

The deflector comprises a pair of electrodes having a direct current (DC) bias applied between the electrodes. The deflector is adjusted to deflect a first group of ions from the ion beam pathway into a first ion trap by maintaining a first DC bias between the electrodes and to deflect a second group of ions from the ion beam pathway into a second ion trap by maintaining a second DC bias between the electrodes. The voltage of the electrodes is further adjusted to direct ions from the ion beam into the other ion traps of the plurality of ion traps. In other words, the ion selector of the '333 Application changes the value of a static electric field to deflect ions of varying mass-to-charge ratios (m/z) from an ion beam. An "ion selector" is used interchangeably in this application with an "ion sorter."

Another type of deflector used for ion sorting or selecting in mass spectrometry is a DC quadrupole ion deflector. Like the deflector of the '333 Application, this deflector is easy to build. However, also like the deflector of the '333 Application, this deflector requires that the kinetic energy be non-zero and identical for all ions, because the electric field works as a kinetic energy analyzer. As a result, although a static electric field ion sorter is easy to build, it may be difficult to precisely control the kinetic energy of all ions in the ion beam.

Radio frequency (RF) ion guides have also been proposed for ion sorting. Japanese Published Application No. 09-213498, U.S. Pat. No. 7,358,488, and International Application No. PCT/US2007/005910, for example, describe using RF ion guide devices. RF ion guide devices can provide selection of wide m/z ranges and low energy ions. RF ion guide devices can also be strongly focused. However, RF ion guide devices are expensive to make and are more complex to operate than static field devices.

In particle accelerator facilities, static magnetic field devices also have been used to select ions. However, these devices select only a single m/z value, because the magnetic field acts a mass analyzer. These devices are also applicable only to high energy applications, and do not work well for slow ions as encountered in mass spectrometry.

Accordingly, a need exists for systems and methods of ion sorting in mass spectrometry that include components that are easy to build and operate and that can separate ions over time, which are of low energy and have different m/z values and different kinetic energies.

SUMMARY

An ion sorter is disclosed for directing an ion beam of mass spectrometer to one of two or more locations. The ion sorter includes a first magnet and a second magnet that each apply a static magnetic field in the same direction to a gap of uniform thickness between the first and second magnets. The ion sorter further includes three or more electrodes located in the gap. Gaps between the three or more electrodes define an input channel for accepting ions of an ion beam of a mass spectrometer and define two or more output channels branching from the input channel. The ion sorter further includes a switchable voltage source in electrical communication with the three or more electrodes. The switchable voltage source can apply voltages to the three or more electrodes to create a static electric field across the input channel and at least one channel of the two or more output channels that is perpendicular to the static magnetic field. The static electric field in conjunction with the static magnetic field causes the ions to move into and through the input channel and through at least one channel of the two or more output channels to another location in the mass spectrometer.

A method is disclosed for directing an ion beam of mass spectrometer to one of two or more locations. A static magnetic field is applied in the same direction using a first magnet and a second magnet to a gap of uniform thickness between the first and second magnets. Voltages are applied to three or more electrodes located in the gap using a switchable voltage source to create a static electric field perpendicular to the static magnetic field in an input channel and at least one channel of two or more output channels defined by gaps between the three or more electrodes. The simultaneous application of the static magnetic field and the static electric field causes the ions from an ion beam of a mass spectrometer to move into and through the input channel and through at least one channel of the two or more output channels to another location in the mass spectrometer.

An ion sorter is disclosed for directing an ion beam of mass spectrometer from one of two or more locations. The ion sorter includes a first magnet and a second magnet that each apply a static magnetic field in the same direction to a gap of uniform thickness between the first and second magnets. The ion sorter further includes three or more electrodes located in the gap. Gaps between the three or more electrodes define two or more input channels for accepting ions from two or more ion beams of a mass spectrometer and an output channel to which each of the two or more input channels is connected. The ion sorter further includes a switchable voltage source in electrical communication with the three or more electrodes. The switchable voltage source can apply voltages to the three or more electrodes to create a static electric field across at least one channel of the two or more input channels and the output channel that is perpendicular to the static magnetic field. The static electric field in conjunction with the static magnetic field causes the ions to move into and through the least one channel of the two or more input channels and through the output channels to a single location in the mass spectrometer.

These and other features of the applicant's teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

Figure 1:
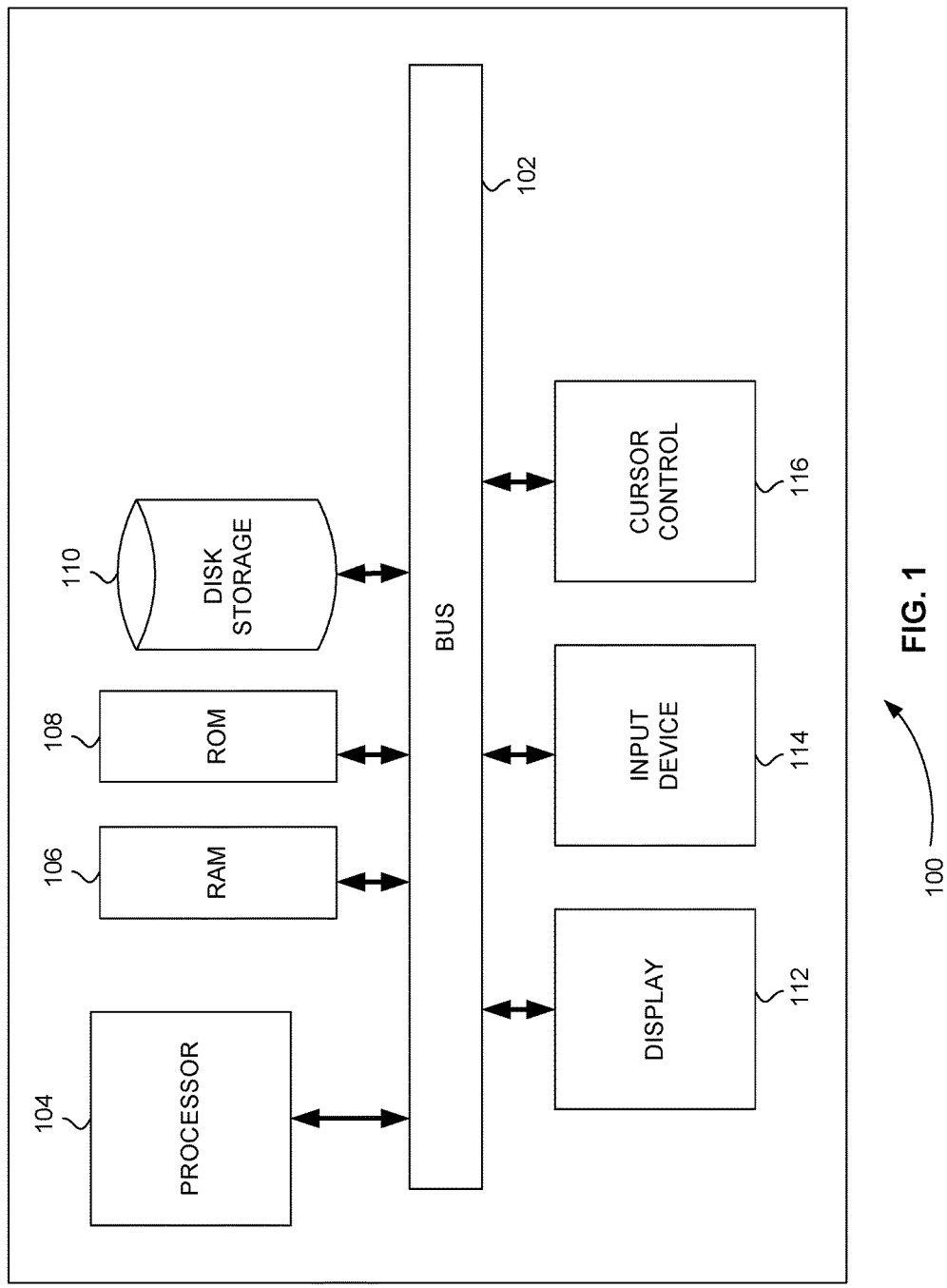
FIG. 1 is a block diagram that illustrates a computer system, upon which embodiments of the present teachings may be implemented.

Before one or more embodiments of the present teachings are described in detail, one skilled in the art will appreciate that the present teachings are not limited in their application to the details of construction, the arrangements of components, and the arrangement of steps set forth in the following detailed description or illustrated in the drawings. Also, it is to be understood that the phraseology and terminology used herein is for the purpose of description and should not be regarded as limiting.

DESCRIPTION OF VARIOUS EMBODIMENTS

Computer-Implemented System

FIG. 1 is a block diagram that illustrates a computer system 100, upon which embodiments of the present teachings may be implemented. Computer system 100 includes a bus 102 or other communication mechanism for communicating information, and a processor 104 coupled with bus 102 for processing information. Computer system 100 also includes a memory 106, which can be a random access memory (RAM) or other dynamic storage device, coupled to bus 102 for storing instructions to be executed by processor 104. Memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or liquid crystal display (LCD), for displaying information to a computer user. An input device 114, including alphanumeric and other keys, is coupled to bus 102 for communicating information and command selections to processor 104. Another type of user input device is cursor control 116, such as a mouse, a trackball or cursor direction keys for communicating direction information and command selections to processor 104 and for controlling cursor movement on display 112. This input device typically has two degrees of freedom in two axes, a first axis (i.e., x) and a second axis (i.e., y), that allows the device to specify positions in a plane.

A computer system 100 can perform the present teachings. Consistent with certain implementations of the present teachings, results are provided by computer system 100 in response to processor 104 executing one or more sequences of one or more instructions contained in memory 106. Such instructions may be read into memory 106 from another computer-readable medium, such as storage device 110. Execution of the sequences of instructions contained in memory 106 causes processor 104 to perform the process described herein. Alternatively hard-wired circuitry may be used in place of or in combination with software instructions to implement the present teachings. Thus implementations of the present teachings are not limited to any specific combination of hardware circuitry and software.

In various embodiments, computer system 100 can be connected to one or more other computer systems, like computer system 100, across a network to form a networked system. The network can include a private network or a public network such as the Internet. In the networked system, one or more computer systems can store and serve the data to other computer systems. The one or more computer systems that store and serve the data can be referred to as servers or the cloud, in a cloud computing scenario. The one or more computer systems can include one or more web servers, for example. The other computer systems that send and receive data to and from the servers or the cloud can be referred to as client or cloud devices, for example.

The term "computer-readable medium" as used herein refers to any media that participates in providing instructions to processor 104 for execution. Such a medium may take many forms, including but not limited to, non-volatile media, volatile media, and transmission media. Non-volatile media includes, for example, optical or magnetic disks, such as storage device 110. Volatile media includes dynamic memory, such as memory 106. Transmission media includes coaxial cables, copper wire, and fiber optics, including the wires that comprise bus 102.

Common forms of computer-readable media or computer program products include, for example, a floppy disk, a flexible disk, hard disk, magnetic tape, or any other magnetic medium, a CD-ROM, digital video disc (DVD), a Blu-ray Disc, any other optical medium, a thumb drive, a memory card, a RAM, PROM, and EPROM, a FLASH-EPROM, any other memory chip or cartridge, or any other tangible medium from which a computer can read.

Various forms of computer readable media may be involved in carrying one or more sequences of one or more instructions to processor 104 for execution. For example, the instructions may initially be carried on the magnetic disk of a remote computer. The remote computer can load the instructions into its dynamic memory and send the instructions over a telephone line using a modem. A modem local to computer system 100 can receive the data on the telephone line and use an infra-red transmitter to convert the data to an infra-red signal. An infra-red detector coupled to bus 102 can receive the data carried in the infra-red signal and place the data on bus 102. Bus 102 carries the data to memory 106, from which processor 104 retrieves and executes the instructions. The instructions received by memory 106 may optionally be stored on storage device 110 either before or after execution by processor 104.

In accordance with various embodiments, instructions configured to be executed by a processor to perform a method are stored on a computer-readable medium. The computer-readable medium can be a device that stores digital information. For example, a computer-readable medium includes a compact disc read-only memory (CD-ROM) as is known in the art for storing software. The computer-readable medium is accessed by a processor suitable for executing instructions configured to be executed.

The following descriptions of various implementations of the present teachings have been presented for purposes of illustration and description. It is not exhaustive and does not limit the present teachings to the precise form disclosed. Modifications and variations are possible in light of the above teachings or may be acquired from practicing of the present teachings. Additionally, the described implementation includes software but the present teachings may be implemented as a combination of hardware and software or in hardware alone. The present teachings may be implemented with both object-oriented and non-object-oriented programming systems.

Systems and Methods for Ion Sorting

As described above, systems and methods that use a static electric field, a radio frequency (RF) electric field, and a static magnetic field have been proposed or used to sort a beam of ions. Each of these systems and methods, however, is either difficult to build and operate or is not well suited for sorting mass spectrometry ions, which are of low energy and have different m/z values and different kinetic energies.

In various embodiments, sample ions are sorted by simultaneously applying both static electric and magnetic fields that are perpendicular to each other to an ion beam in order to direct the motion of the ions. The force applied by static electric and magnetic fields that are perpendicular to each other is the well-known Lorentz force. The direction of the force applied is also perpendicular to the directions of the static electric and magnetic fields.

Figure 2:
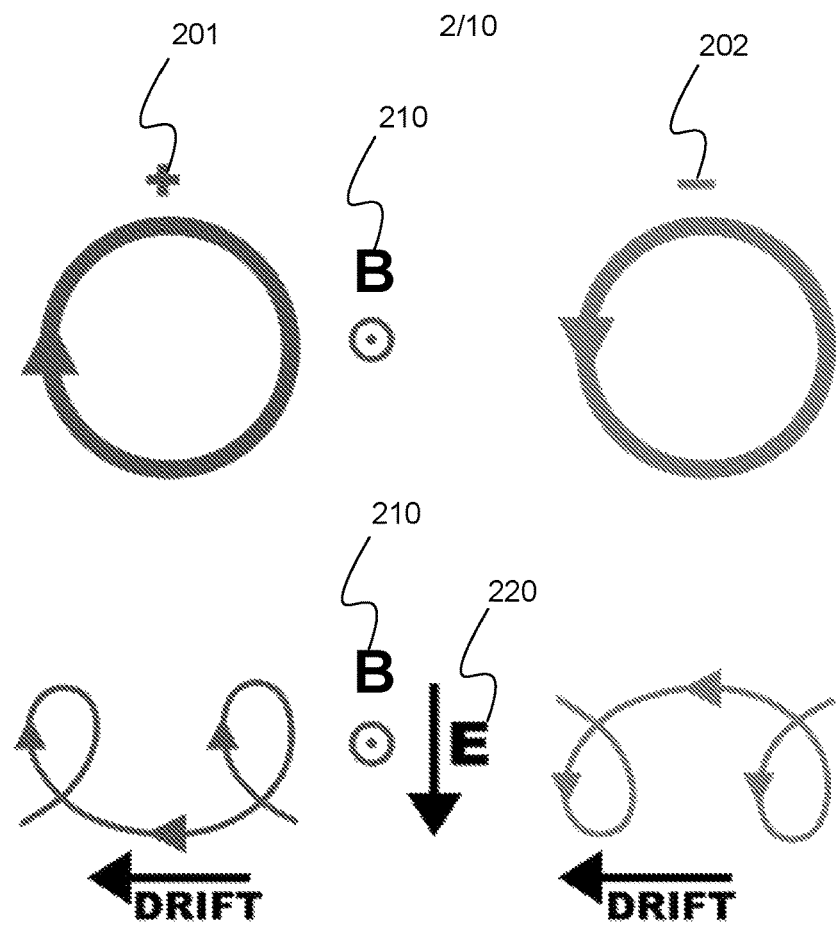
FIG. 2 is an exemplary diagram of the effect of perpendicular static electric and magnetic fields on both positively and negatively charged particles due to the Lorentz force.

FIG. 2 is an exemplary diagram 200 of the effect of perpendicular static electric and magnetic fields on both positively and negatively charged particles due to the Lorentz force. Under just the influence of static magnetic field 210, which is directed upward out of the page, positively charged particle 201 has a clockwise rotational motion and negatively charged particle 202 has a counterclockwise rotational motion. However, when static electric field 220 is applied simultaneously with static magnetic field 210 and perpendicular to static magnetic field 210, positively charged particle 201 and negatively charged particle 202 experience a translational force or drift. The direction of the translational force is also perpendicular to static electric field 220 and static magnetic field 210.

In various embodiments, the Lorentz force is used to change the direction of a beam of ions in a mass spectrometer. A magnetic field is applied using one or more magnets.

Figure 3:
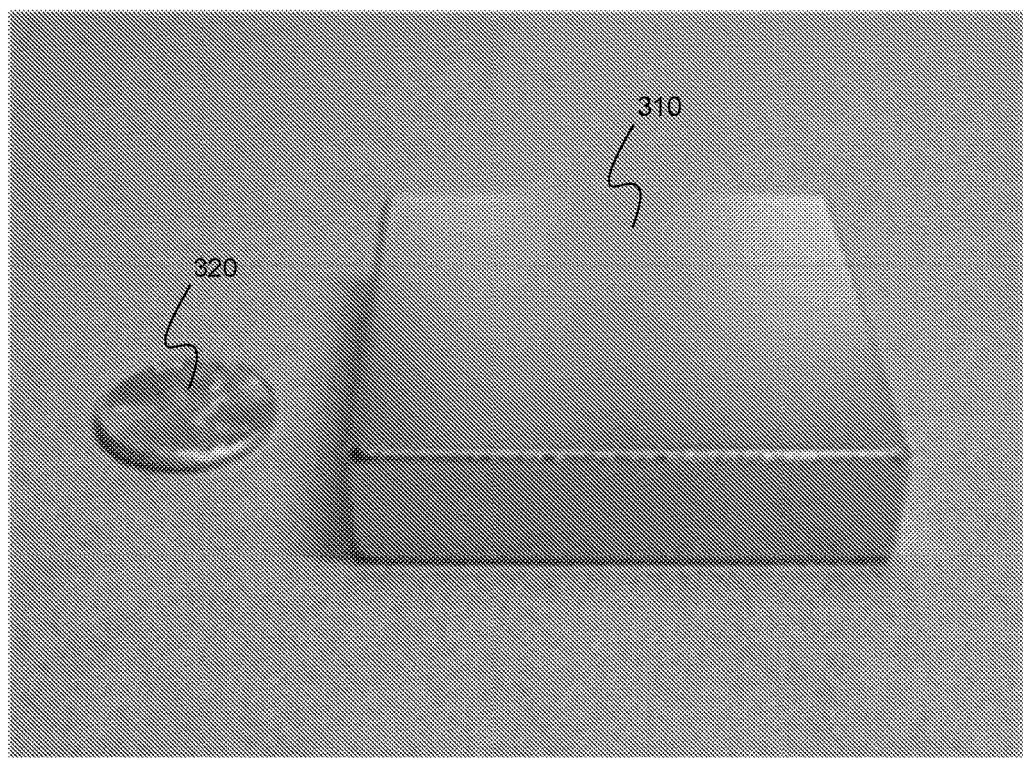
FIG. 3 is an exemplary image of a magnet for applying a magnetic field to an ion beam in order to redirect the ion beam in a mass spectrometer, in accordance with various embodiments.

FIG. 3 is an exemplary image 300 of a magnet for applying a magnetic field to an ion beam in order to redirect the ion beam in a mass spectrometer, in accordance with various embodiments. Image 300 shows the size of magnet 310 in comparison to a penny 320.

An electric field is applied to the beam of ions using three or more electrodes. The three or more electrodes are separated by three or more gaps or channels. The electrodes can be printed on a printed circuit board (PCB), for example.

Figure 4:
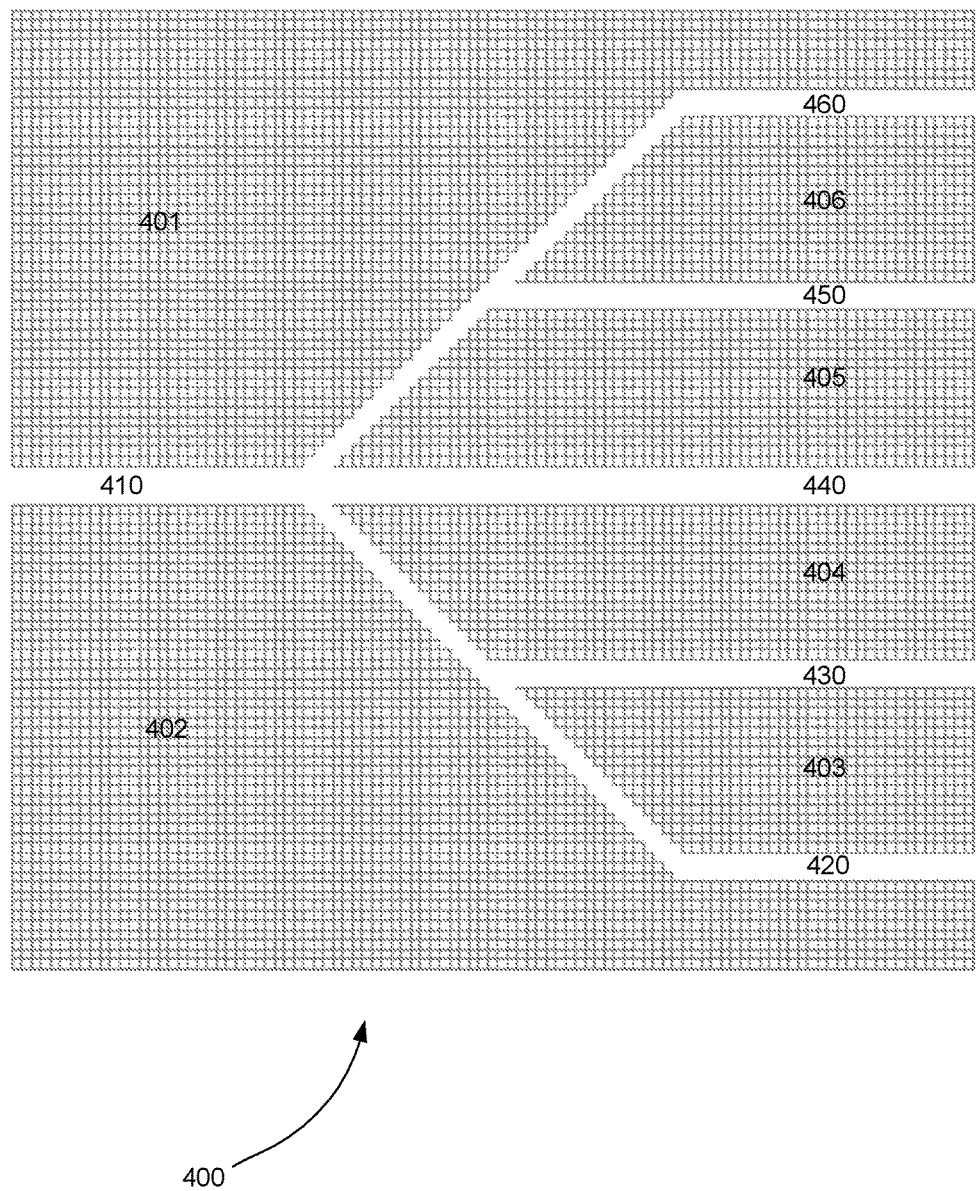
FIG. 4 is an exemplary diagram of six electrodes printed on a printed circuit board (PCB) for applying an electric field to an ion beam in order to redirect the ion beam in a mass spectrometer, in accordance with various embodiments.

FIG. 4 is an exemplary diagram 400 of six electrodes printed on a PCB for applying an electric field to an ion beam in order to redirect the ion beam in a mass spectrometer, in accordance with various embodiments. Electrodes 401-406, for example, define one input channel and five output channels for the ion beam. The input channel is channel 410 and the output channels are channels 420-460. In various embodiments, electrodes 401-406 can be used to direct ions in the opposite direction. In other words, electrodes 401-406 can receive ions from one of five different ion beams and send them to one location. In this embodiment, channels 420-460 are input channels and channel 410 is a single output channel Electrodes 401-406 and channels 420-460 are shown as having straight edges. In various embodiments, the electrodes can have curved edges carving out curved channels.

Figure 5:
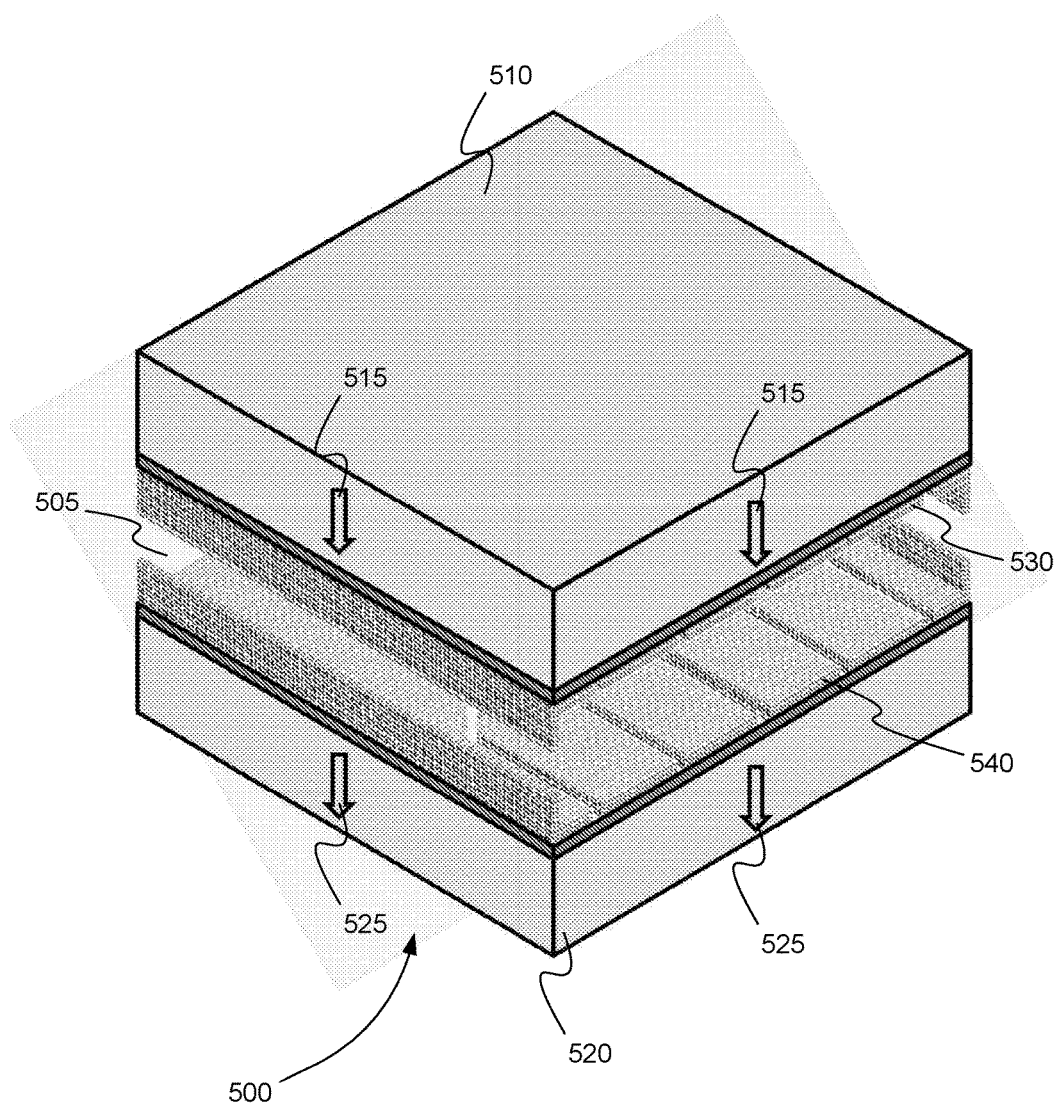
FIG. 5 is an exemplary diagram of two magnets and two sets of electrodes being used to apply static magnetic and electric fields to an ion beam in order to redirect the ion beam in a mass spectrometer, in accordance with various embodiments.

In various embodiments, the static magnetic and electric fields are created using two magnets and two sets of electrodes. The use of two magnets that each produces the same magnetic field in the same direction insures that the direction of the magnetic field in each channel does not change along a width of the channel Similarly, the use of two sets of electrodes that each produces the same electric field in the same direction insure that the direction of the electric field in each channel does not change along a width of the channel FIG. 5 is an exemplary diagram 500 of two magnets and two sets of electrodes being used to apply static magnetic and electric fields to an ion beam in order to redirect the ion beam in a mass spectrometer, in accordance with various embodiments. Magnets 510 and 520 are positioned so that magnetic fields 515 and 525 produce a magnetic field in the gap between magnets 510 and 520 that has the same direction throughout gap 505. Magnets 510 and 520 are, for example, magnets like the one shown in FIG. 3.

Set of electrodes 530 is shown attached to the underside of magnet 510, and set of electrodes 540 is shown attached to the top of magnet 520. Sets of electrodes 530 and 540 are positioned in gap 505 so that their electrodes and channels align. The same DC voltage is applied to corresponding electrodes of sets of electrodes 530 and 540 in order to direct the ion beam in the channels. Sets of electrodes 530 and 540 include, for example, electrodes printed on PCBs like the electrodes shown in FIG. 4.

In various embodiments, the ions are sorted by redirecting the path of an ion beam at different times. The path of the ion beam is redirected by changing the direction of the electric field in the plane perpendicular to the magnetic field. The direction of the electric field is changed by changing the voltages applied to one or more electrodes defining the channels of possible ion beam flow. In other words, the voltages on branched paths are switched to a different pattern.

Figure 6:
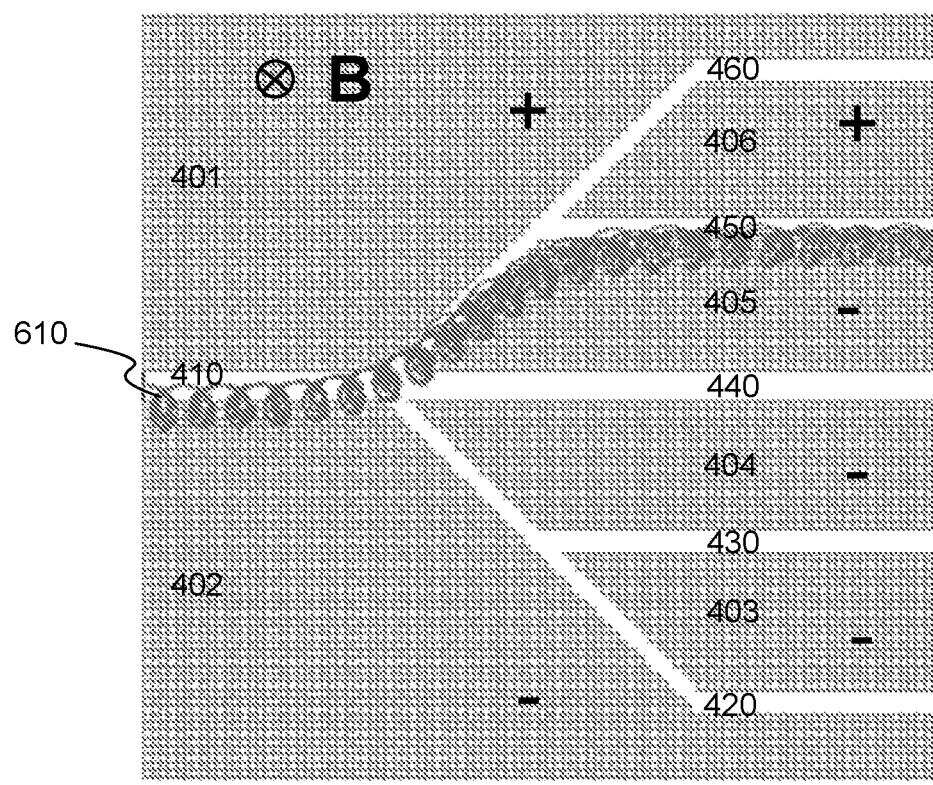
FIG. 6 is an exemplary diagram of six electrodes printed on a PCB showing how an ion beam in a sorting device is directed to a channel defined by the electrodes based on the voltages applied to the electrodes, in accordance with various embodiments.

FIG. 6 is an exemplary diagram 600 of six electrodes printed on a PCB showing how an ion beam in a sorting device is directed to a channel defined by the electrodes based on the voltages applied to the electrodes, in accordance with various embodiments. Ion beam 610 is received by channel 410. Ion beam 610 is then directed to channel 460 by applying a positive voltage to electrodes 401 and 406 and a negative voltage to electrodes 402-405.

Figure 7:
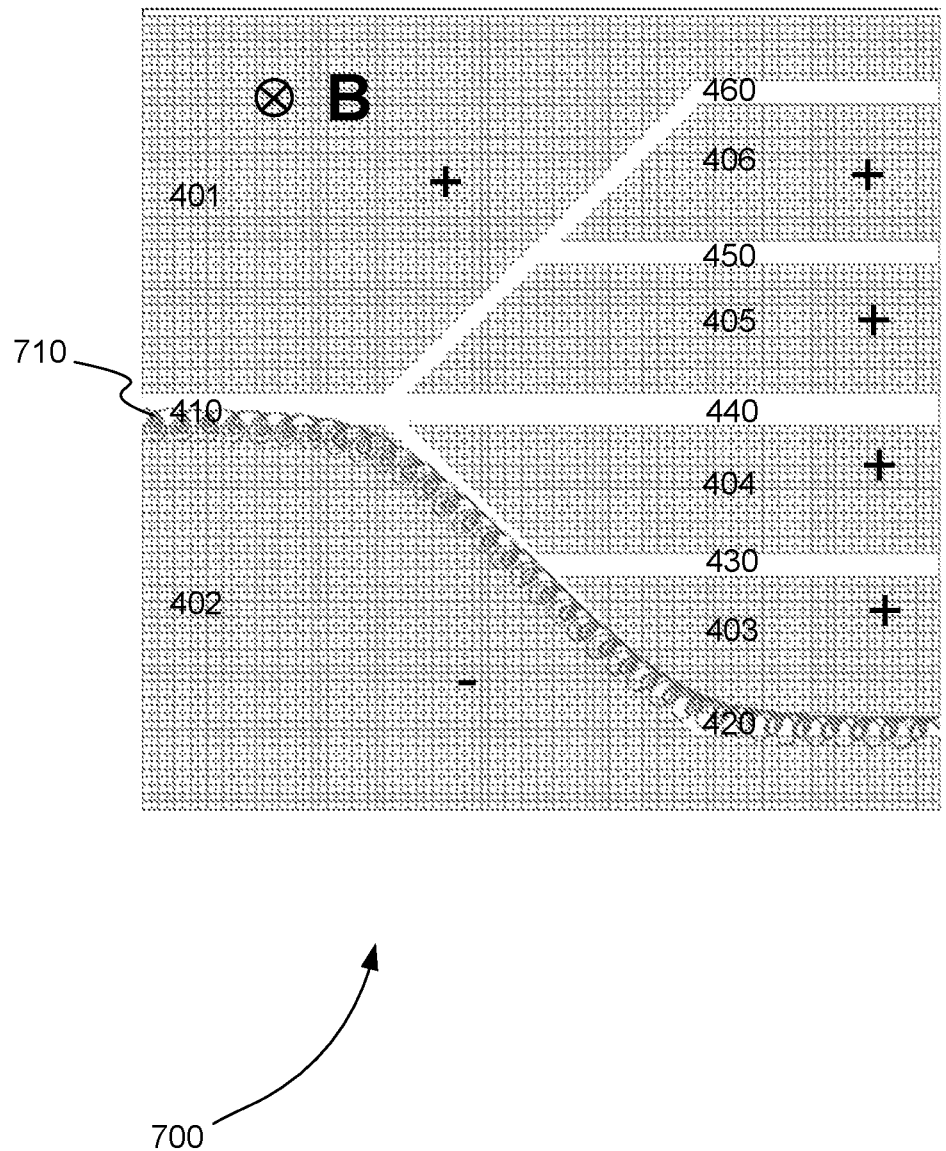
FIG. 7 is an exemplary diagram of the same six electrodes shown in FIG. 6 showing how an ion beam in a sorting device is directed to an alternative channel defined by the electrodes based on the voltages applied to the electrodes, in accordance with various embodiments.

FIG. 7 is an exemplary diagram 700 of the same six electrodes shown in FIG. 6 showing how an ion beam in a sorting device is directed to an alternative channel defined by the electrodes based on the voltages applied to the electrodes, in accordance with various embodiments. Ion beam 710 is received by channel 410. Ion beam 710 is then directed to channel 420 by applying a positive voltage to electrodes 401 and 403-406 and a negative voltage to electrode 402.

In various embodiments, an ion sorter is used in a mass spectrometer to increase the ion path from one path to many paths. In other words, the ion sorter is used as a multiplexer. The ion sorter can be used as a multiplexer in any stage of a mass spectrometer. For example, it can be used to distribute an ion beam from a single ion source to multiple mass filters. It can be used to distribute an ion beam from a single mass filter to multiple collision cells. It can be used to distribute an ion beam from a single collision cell to multiple mass analyzers.

Figure 8:
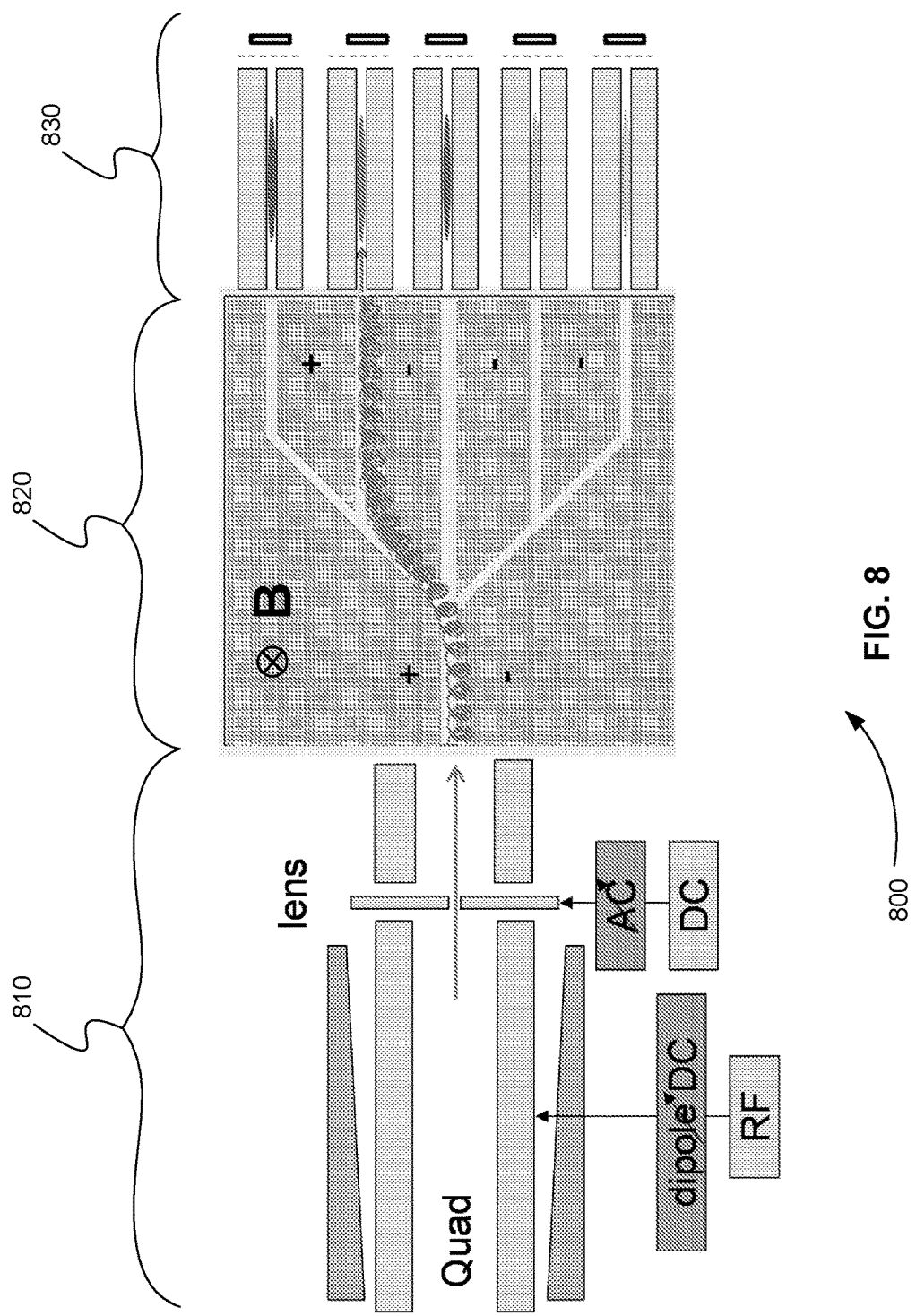
FIG. 8 is an exemplary diagram showing an ion sorter being used to extract ions from a single linear ion trap into one of five different ion traps for mass analysis, in accordance with various embodiments.

FIG. 8 is an exemplary diagram 800 showing an ion sorter being used to extract ions from a single linear ion trap into one of five different ion traps for mass analysis, in accordance with various embodiments. Linear ion trap 810 is a system for mass selectively extracting ions. Such a system is described in U.S. Provisional Application No. 62/033,380, for example. Trapped ions in a preset m/z band are extracted without excitation. Mass selected ions with low kinetic energy are introduced into ion sorter 820. The mass selected ions are sorted, or redirected over time, to an ion trap in the array of ion traps 830. Array of ion traps 830 includes a detector for each trap. The mass selected ions in different m/z bands are directed to the five ion traps of array of ion traps 830 over time, for example. Precursor ions in each m/z band are dissociated and mass analyzed by the five ion traps of array of ion traps 830 simultaneously, increasing the overall throughput of system 800.

In various embodiments, an ion sorter can alternatively be used in a mass spectrometer to decrease the number of ion paths. In other words, the ion sorter can be used as a demultiplexer. The ion sorter can also be used as a demultiplexer in any stage of a mass spectrometer. For example, in FIG. 8, array of ion traps 830 includes a detector for each trap. In an alternative embodiment, output from the array of ion traps 830 can be demultiplexed to a single detector using an ion sorter similar to ion sorter 820, except that this ion sorter would have five input paths and one output path.

Ion Sorter for Multiplexing

Figure 9:
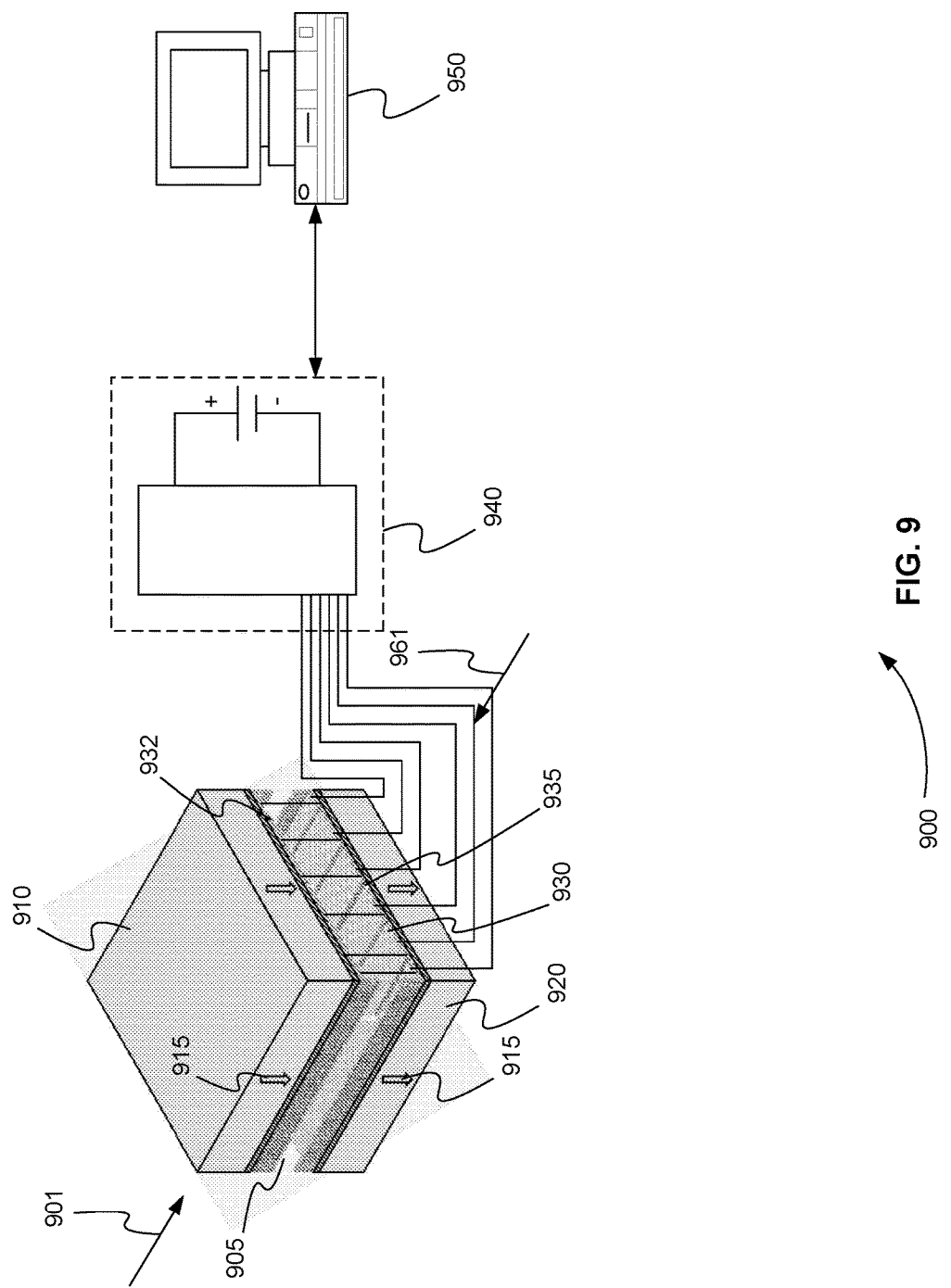
FIG. 9 is a schematic diagram of an ion sorter, in accordance with various embodiments.

FIG. 9 is a schematic diagram of an ion sorter 900, in accordance with various embodiments. Ion sorter 900 is used, for example, to direct an ion beam of mass spectrometer (not shown) to one of two or more locations. The ion beam is from direction 901, for example. Ion sorter 900 includes first magnet 910, second magnet 920, three or more electrodes 930, and switchable voltage source 940.

First magnet 910 and second magnet 920 each applies static magnetic field 915 in the same direction to gap 905 of uniform thickness between first magnet 910 and second magnet 920. Static magnetic field 915 does not have to be uniform in intensity across the surface of first magnet 910 and second magnet 920. However, static magnetic field 915 does have to have a uniform direction across the surface of first magnet 910 and second magnet 920. Gaps 935 between three or more electrodes 930 define an input channel for accepting ions of an ion beam of a mass spectrometer and define two or more output channels branching from the input channel Switchable voltage source 940 is in electrical communication with three or more electrodes 930. Switchable voltage source 940 can apply voltages to three or more electrodes 930 to create a static electric field across the input channel and at least one channel of the two or more output channels that is perpendicular to static magnetic field 915. The static electric field in conjunction with static magnetic field 915 causes the ions to move into and through the input channel and through at least one channel of the two or more output channels to another location in the mass spectrometer.

In various embodiments, ion sorter 900 further includes processor 950. Processor 950 can be, but is not limited to, a computer, microprocessor, the computer system of FIG. 1, or any device capable of controlling devices, processing data, and sending and receiving data. Processor 950 is in communication with switchable voltage source 940. Processor 950 selects a channel of the two or more output channels for the ions. Processor 950 instructs switchable voltage source 940 to apply voltages to three or more electrodes 930 to create a static electric field across the input channel and the selected channel so that a combination of the static electric field and the static magnetic field moves the ions of the ion beam through the input channel and the selected output channel to a location in the mass spectrometer.

In various embodiments, first magnet 910 and second magnet 920 are block permanent magnets. First magnet 910 and second magnet 920 can be neodymium magnets, for example. In various alternative embodiments, first magnet 910 and second magnet 920 are electromagnets.

In various embodiments, static magnetic field 915 is greater than or equal to 0.5 Tesla. For example, the m/z of the ions is less than 200 Da, static magnetic field 915 is greater than or equal to 0.5 Tesla and less than or equal to 1 Tesla. If the m/z of the ions is less than 1000 Da, static magnetic field 915 is greater than or equal to 1 Tesla and less than or equal to 2 Tesla.

In various embodiments, an iron pole piece (not shown) is located between second magnet 920 and three or more electrodes 930 and between first magnet 910 and second set of three or more electrodes 932.

In various embodiments, three or more electrodes 930 are printed on a PCB. In various embodiments, ion sorter 900 further includes second set of three or more electrodes 932 printed on a second PCB. The PCB is located proximate first magnet 910 and the second PCB is located proximate second magnet 920. The PCB and second PCB are in parallel. Three or more electrodes 930 and second set of three or more electrodes 932 face each other and facing electrodes are electrically connected. Three or more electrodes 930 and second set of three or more electrodes 932 act as ion guides.

In various embodiments, switchable voltage source 940 applies one of a high voltage state and low voltage state to the three or more electrodes 932. The high voltage state is greater than or equal to 0.1 Volts and less than or equal to 10 Volts compared to a voltage of a segment of the mass spectrometer providing the ions, for example. The low voltage state is greater than or equal to 10 Volts and less than or equal to −0.1 Volts compared to a voltage of a segment of the mass spectrometer providing the ions.

Ion Sorter for Demultiplexing

Ion sorter 900 of FIG. 9 can also be used to direct an ion beam of mass spectrometer (not shown) from one of two or more locations. In other words, ion sorter 900 can be used for demultiplexing.

Two or more ions beams in this case are from direction 961, for example. First magnet 910 and second magnet 920 each applies static magnetic field 915 in the same direction to gap 905 of uniform thickness between first magnet 910 and second magnet 920. Gaps 935 between three or more electrodes 930 define two or more input channels for accepting ions from two or more ion beams of a mass spectrometer and an output channel to which each of the two or more input channels is connected.

Switchable voltage source 940 is in electrical communication with three or more electrodes 930. Switchable voltage source 940 can apply voltages to three or more electrodes 930 to create a static electric field across at least one channel of the two or more input channels and the output channel that is perpendicular to static magnetic field 915. The static electric field in conjunction with static magnetic field 915 causes the ions to move into and through the least one channel of the two or more input channels and through the output channels to a single location in the mass spectrometer.

In various embodiments, ion sorter 900 further includes processor 950.

Processor 950 can be, but is not limited to, a computer, microprocessor, the computer system of FIG. 1, or any device capable of controlling devices, processing data, and sending and receiving data. Processor 950 is in communication with switchable voltage source 940. Processor 950 selects a channel of the two or more output channels for the ions. Processor 950 instructs switchable voltage source 940 to apply voltages to three or more electrodes 930 to create a static electric field across the selected channel and the output channel so that a combination of the static electric field and the static magnetic field moves the ions of the ion beam through the selected channel and the output channel to a single location in the mass spectrometer.

Method for Directing an Ion Beam

Figure 10:
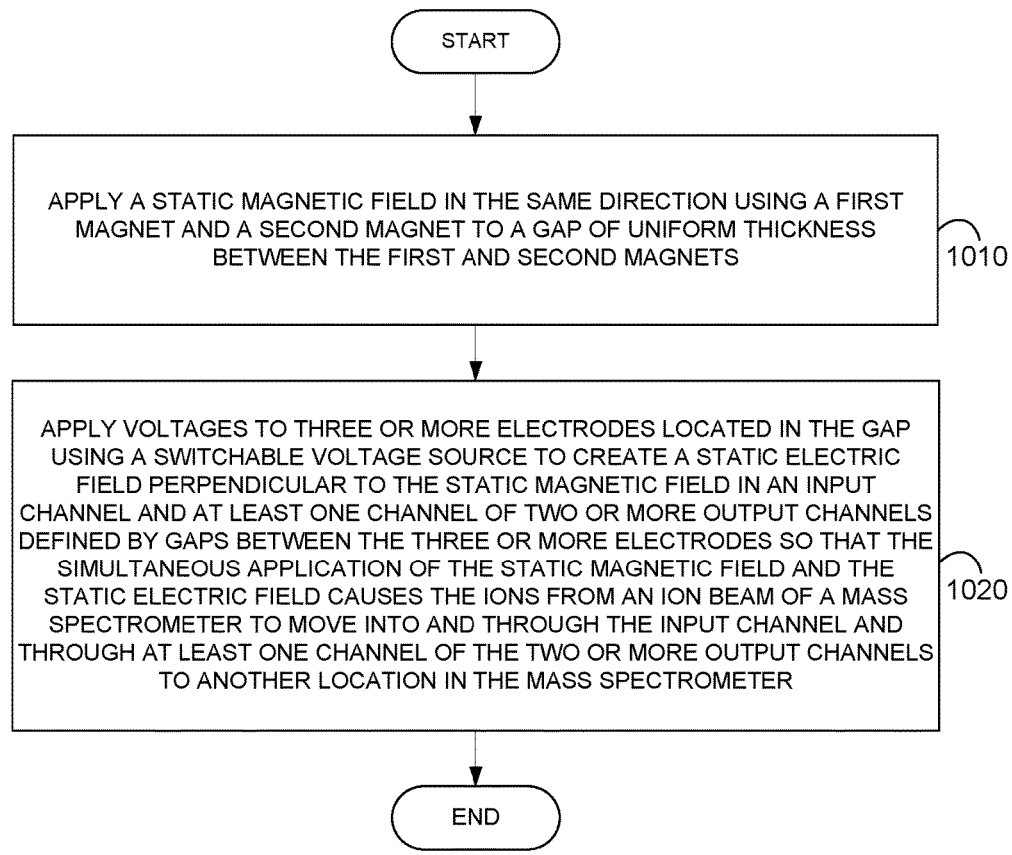
FIG. 10 is a flowchart showing a method for directing an ion beam of mass spectrometer to one of two or more locations, in accordance with various embodiments.

FIG. 10 is a flowchart showing a method 1000 for directing an ion beam of mass spectrometer to one of two or more locations, in accordance with various embodiments.

In step 1010 of method 100, a static magnetic field is applied in the same direction using a first magnet and a second magnet in case electromagnets are used. The magnetic field is applied to a gap of uniform thickness between the first and second magnets In step 1020, voltages are applied to three or more electrodes located in the gap using a switchable voltage source. The voltages are applied to create a static electric field perpendicular to the static magnetic field in an input channel and at least one channel of two or more output channels. The channels are defined by gaps between the three or more electrodes. The simultaneous application of the static magnetic field and the static electric field causes the ions from an ion beam of a mass spectrometer to move into and through the input channel and through at least one channel of the two or more output channels to another location in the mass spectrometer.

While the present teachings are described in conjunction with various embodiments, it is not intended that the present teachings be limited to such embodiments. On the contrary, the present teachings encompass various alternatives, modifications, and equivalents, as will be appreciated by those of skill in the art.

Further, in describing various embodiments, the specification may have presented a method and/or process as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process should not be limited to the performance of their steps in the order written, and one skilled in the art can readily appreciate that the sequences may be varied and still remain within the spirit and scope of the various embodiments.

What is claimed is:

1. An ion sorter for directing an ion beam of mass spectrometer to one of two or more locations, comprising:
   a first magnet and a second magnet that each apply a static magnetic field in the same direction to a gap of uniform thickness between the first and second magnets;
   three or more electrodes located in the gap,
      wherein gaps between the three or more electrodes define an input channel for accepting ions of an ion beam of a mass spectrometer and define two or more output channels branching from the input channel; and
   a switchable voltage source in electrical communication with the three or more electrodes that can apply voltages to the three or more electrodes to create a static electric field across the input channel and at least one channel of the two or more output channels that is perpendicular to the static magnetic field and that in conjunction with the static magnetic field causes the ions to move into and through the input channel and through at least one channel of the two or more output channels to another location in the mass spectrometer.

2. The ion sorter of claim 1, further comprising
   a processor in communication with the switchable voltage source that
      selects a channel of the two or more output channels for the ions and
      instructs the switchable voltage source to apply voltages to the three or more electrodes to create a static electric field across the input channel and the selected channel so that a combination of the static electric field and the static magnetic field moves the ions of the ion beam through the input channel and the selected output channel to a location in the mass spectrometer.

3. The ion sorter of claim 1, wherein the static magnetic field is not uniform in intensity across the surface of the first magnet and the second magnet.

4. The ion sorter of claim 1, wherein the static magnetic field is uniform in direction across the surface of the first magnet and the second magnet.

5. The ion sorter of claim 1, wherein at least one of the first and second magnets is a block permanent magnet.

6. The ion sorter of claim 1, wherein at least one of the first and second magnets is an electromagnet.

7. The ion sorter of claim 1, wherein the static magnetic field is greater than or equal to 0.5 Tesla.

8. The ion sorter of claim 1, wherein if the mass-to-charge ratio (m/z) of the ions is less than 200 Da, the static magnetic field is greater than or equal to 0.5 Tesla and less than or equal to 1 Tesla.

9. The ion sorter of claim 1, wherein if the mass-to-charge ratio (m/z) of the ions is less than 1000 Da, the static magnetic field is greater than or equal to 1 Tesla and less than or equal to 2 Tesla.

10. The ion sorter of claim 1, wherein an iron pole piece is located between the first magnet and the three or more electrodes or between the second magnet and the three or more electrodes.

11. The ion sorter of claim 1, wherein the first magnet or the second magnet is a neodymium magnet.

12. The ion sorter of claim 1, wherein the three or more electrodes are printed on a printed circuit board (PCB).

13. The ion sorter of claim 12, further comprising a second set of three or more electrodes printed on a second PCB.

14. The ion sorter of claim 13, wherein the PCB is located proximate the first magnet and the second PCB is located proximate the second magnet, the PCB and second PCB are in parallel, the three or more electrodes and the second set of three or more electrodes face each other and facing electrodes are electrically connected, and the three or more electrodes and the second set of three or more electrodes act as ion guides.

15. The ion sorter of claim 1, wherein the switchable voltage source applies one of a high voltage state and low voltage state to the three or more electrodes.

16. The ion sorter of claim 15, wherein the high voltage is greater than or equal to 0.1 Volts and less than or equal to 10 Volts compared to a voltage of a segment of the mass spectrometer providing the ions.

17. The ion sorter of claim 15, wherein the low voltage state is greater than or equal to −10 Volts and less than or equal to −0.1 Volts compared to a voltage of a segment of the mass spectrometer providing the ions.

18. A method for directing an ion beam of mass spectrometer to one of two or more locations, comprising
applying a static magnetic field in the same direction using a first magnet and a second magnet to a gap of uniform thickness between the first and second magnets; and
applying voltages to three or more electrodes located in the gap using a switchable voltage source to create a static electric field perpendicular to the static magnetic field in an input channel and at least one channel of two or more output channels defined by gaps between the three or more electrodes so that the simultaneous application of the static magnetic field and the static electric field causes the ions from an ion beam of a mass spectrometer to move into and through the input channel and through at least one channel of the two or more output channels to another location in the mass spectrometer.

19. The method of claim 18, further comprising
selecting a channel of the two or more output channels for the ions using a processor in communication with the switchable voltage source and
instructing the switchable voltage source to apply voltages to the three or more electrodes to create a static electric field across the input channel and the selected channel so that a combination of the static electric field and the static magnetic field moves the ions of the ion beam through the input channel and the selected output channel to a location in the mass spectrometer.

20. An ion sorter for directing an ion beam of mass spectrometer from one of two or more locations, comprising
a first magnet and a second magnet that each apply a static magnetic field in the same direction to a gap of uniform thickness between the first and second magnets;
three or more electrodes located in the gap,
wherein gaps between the three or more electrodes define two or more input channels for accepting ions from two or more ion beams of a mass spectrometer and an output channel to which each of the two or more input channels is connected; and
a switchable voltage source in electrical communication with the three or more electrodes that can apply voltages to the three or more electrodes to create a static electric field across at least one channel of the two or more input channels and the output channel that is perpendicular to the static magnetic field and that in conjunction with the static magnetic field causes the ions to move into and through the least one channel of the two or more input channels and through the output channels to a single location in the mass spectrometer.

21. The ion sorter of claim 20, further comprising
a processor in communication with the switchable voltage source that
selects a channel of the two or more input channels for the ions and
instructs the switchable voltage source to apply voltages to the three or more electrodes to create a static electric field across the selected channel and the output channel so that a combination of the static electric field and the static magnetic field moves the ions of the ion beam through the selected channel and the output channel to a single location in the mass spectrometer.

* * * * *